US005808459A

United States Patent [19]

[11] Patent Number: 5,808,459
[45] Date of Patent: Sep. 15, 1998

Yazdy et al.

[54] DESIGN TECHNIQUE FOR CONVERTING A FLOATING BAND-GAP REFERENCE VOLTAGE TO A FIXED AND BUFFERED REFERENCE VOLTAGE

[75] Inventors: Mostafa R. Yazdy; Harry J. McIntyre, both of Los Angeles, Calif.

[73] Assignee: Xerox Corporation, Stamford, Conn.

[21] Appl. No.: 960,782

[22] Filed: Oct. 30, 1997

[51] Int. Cl.[6] .............................. G05F 3/16; H03F 3/45; H03F 3/04

[52] U.S. Cl. .......................... 323/314; 323/316; 330/257; 330/288

[58] Field of Search .................................... 323/313, 314, 323/315, 316; 330/257, 288; 327/541, 543

[56] References Cited

U.S. PATENT DOCUMENTS

| | | | |
|---|---|---|---|
| 5,319,303 | 6/1994 | Yamada | 323/313 |
| 5,339,272 | 8/1994 | Tedrow et al. | 323/316 |
| 5,519,310 | 5/1996 | Bartlett | 323/316 |
| 5,521,489 | 5/1996 | Fukami | 323/316 |
| 5,734,293 | 3/1998 | Gross | 323/316 |

*Primary Examiner*—Edward Tso
*Assistant Examiner*—Bao Q. Vu
*Attorney, Agent, or Firm*—Fariba Rad

[57] ABSTRACT

There is disclosed a converter for converting a floating voltage of a Band Gap Reference voltage generator fabricated in P-substrate CMOS technology to a fixed voltage with respect to ground. The converter of this invention utilizes a subtractor to convert the floating voltage to a fixed reference voltage. In addition, the converter of this invention utilizes two level shifters which are able to level shift the floating voltage down and level shift the shifted down voltage substantially back to the level of the floating voltage in order to allow a buffer to be used prior to the subtractor.

12 Claims, 5 Drawing Sheets

DESIGN TECHNIQUE FOR CONVERTING A FLOATING BAND-GAP REFERENCE VOLTAGE TO A FIXED AND BUFFERED REFERENCE VOLTAGE

INCORPORATION BY REFERENCE

The following U.S. patent application is fully incorporated by reference: U.S. patent application Ser. No. 08/868,622, "A Buffering Integrated Circuit With Level Shifting Function" Attorney docket No. D/97532 (Common Assignee) filed concurrently herewith.

BACKGROUND OF THE INVENTION

This invention relates generally to a voltage converter and more particularly, to a voltage converter utilized to convert a floating reference voltage of a Band-Gap reference voltage generator of an integrated circuit, which is built in P-substrate CMOS technology, to a fixed reference voltage with respect to ground.

Typically, a highly accurate and temperature independent Band-Gap Reference voltage generator for integrated circuits can be designed by using bipolar technologies. However, due to the popularity of the CMOS process and in particular P-substrate CMOS process, it is desirable to design a Band-Gap Reference voltage generator using bipolar transistors fabricated with P-substrate CMOS technology. Fabricating a bipolar transistor in P-substrate CMOS technology is well known in the industry. Yet, designing a Band-Gap Reference voltage generator with bipolar transistors in P-substrate CMOS technology creates a reference voltage with respect to the power supply.

For the purpose of simplicity, hereinafter, the "Band-Gap Reference voltage generator is referred to as "BGR voltage generator".

It is not desirable to have a reference voltage with respect to the power supply since the transient variation of the voltage of the power supply causes the output of the BGR voltage generator to vary (float). A typical voltage generator is designed to generate a reference voltage with respect to the ground of the integrated circuit and therefore the voltage is substantially fixed as the power supply voltage or the temperature varies.

The reason a reference voltage generated by P-substrate CMOS technology is a floating voltage is that the bipolar transistors fabricated by P-substrate CMOS technology are PNP transistors. In order to generate a reference voltage with respect to the ground, NPN transistors are required which can be easily fabricated in N-substrate CMOS technology.

Referring to FIG. 1, there is shown a bipolar transistor 10 fabricated with P-substrate CMOS technology. In P-substrate CMOS technology, the substrate is typically connected to ground or to the most negative voltage used in the integrated circuit. Therefore, in P-substrate CMOS technology, in order to create a bipolar transistor, the bipolar transistor has to be created in a well. Since the substrate is a p-substrate, the well has to be n-well which then dictates that the bipolar transistor be a PNP transistor. In this type of configuration, n-well is used as the base B, one of the p+ regions is used as collector C and the other p+ region is used as the emitter E of the bipolar transistor 10.

In FIG. 1, layer 12 is an insulator and layer 14 is a material such as aluminum to be used for the gate G of a P-substrate CMOS transistor. Since the transistor 10 is used as a bipolar transistor, gate G is connected to a voltage above 5 volts which does not affect the function of bipolar transistor 10.

Referring to FIG. 2, there is shown a block diagram of a BGR voltage generator 20 built with NPN transistors which generates a temperature independent fixed 1 volt reference voltage with respect to ground. Since the reference voltage 1 volt is generated with respect to ground and the voltage of ground is designated as zero, the output voltage $V_{R1}$ of the BGR voltage generator 20 is 1 volt.

Referring to FIG. 3, there is shown a block diagram of a BGR voltage generator 30 built with PNP transistors. The BGR voltage generator 30 generates a temperature independent reference voltage which is always 1 volt below the voltage of the power supply. The BGR voltage generator 30 generates a fixed 1 volt reference voltage with respect to power supply $V_2$ and since the voltage of the power supply $V_2$ is typically 5 volts, the output $V_{R2}$ of the BGR voltage generator 30 is 5−1=4 volts. The output voltage of the BGR voltage generator 30 is floating since any transient change in the power supply causes the output voltage $V_{R2}$ to vary. For example, if the voltage of the power supply changes to 5.2, then the output $V_{R2}$ is 5.2−1=4.2 volts.

Therefore, in this specification "a Band-Gap reference voltage with a floating reference voltage" and a "floating voltage source generating a floating voltage" both shall mean a Band-Gap reference voltage generator which generates a fixed reference voltage independent of temperature change and outputs a voltage such that the difference between the voltage of the power supply and the output voltage is a fixed voltage independent of temperature variations.

It is an object of this invention to provide a design technique for converting a floating band-gap reference voltage to a fixed and buffered reference voltage in order to provide a solution to a floating voltage of a band-gap reference voltage generator built with P-substrate CMOS technology.

SUMMARY OF THE INVENTION

In accordance with one aspect of this invention, there is disclosed a converter which utilizes a subtractor to convert a floating voltage of a voltage generator to a fixed voltage. In this invention, the voltage of a power supply is connected to one input of the subtractor. However, in order to connect a floating voltage generator to the other input of the subtractor, a buffer is needed which requires the floating voltage to be shifted down prior to the buffer and shifted up to substantially the level of the floating voltage after the buffer. The present invention is directed to converting a floating voltage of a Band Gap Reference voltage generator to a fixed reference voltage.

In accordance with another aspect of this invention, there is disclosed yet another converter to convert a floating voltage to a fixed voltage. This converter again utilizes a subtractor to convert a floating voltage to a fixed voltage. In this converter, the voltage of a power supply is connected to one of the inputs of the subtractor through a first level shifter and a first buffer and the voltage of the floating voltage generator is connected to the other input of the subtractor through a second level shifter and a second buffer. Each one of the buffers prevents any current being drawn from its respective voltage generator and each level shifter shifts down its respective voltage to match the required voltage of its respective buffer.

DESCRIPTION OF THE PREFERRED EMBODIMENT

Figure 1:
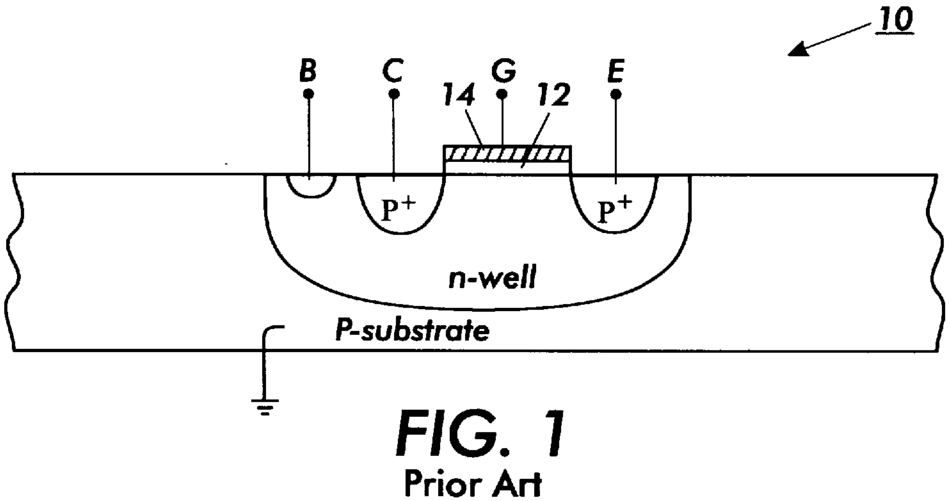
FIG. 1 Prior Art
FIG. 1 shows a bipolar transistor fabricated with P-substrate CMOS technology.
Figure 2:
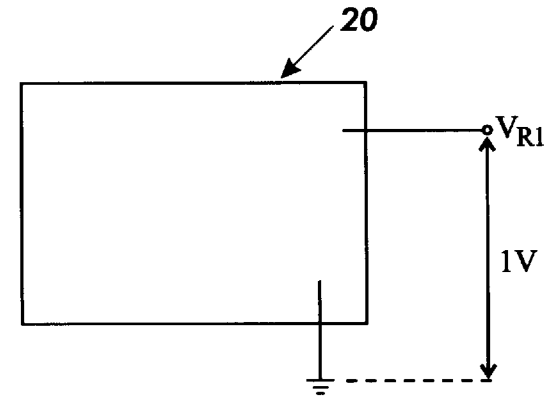
FIG. 2 Prior Art
FIG. 2 shows a block diagram of a reference voltage built with NPN transistors which generates a temperature independent voltage with respect to ground.
Figure 3:
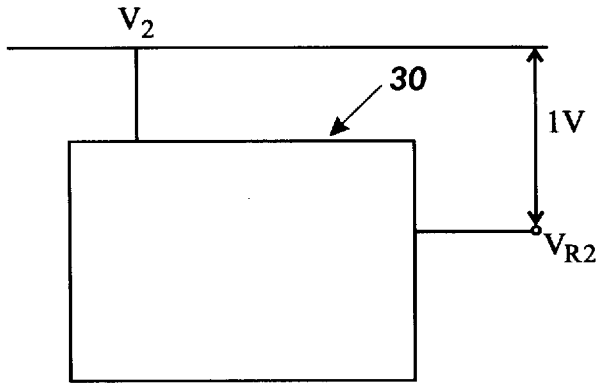
FIG. 3 Prior Art
FIG. 3 shows a block diagram of a reference voltage built with PNP transistors which generates a temperature independent voltage with respect to a power supply.
Figure 4:
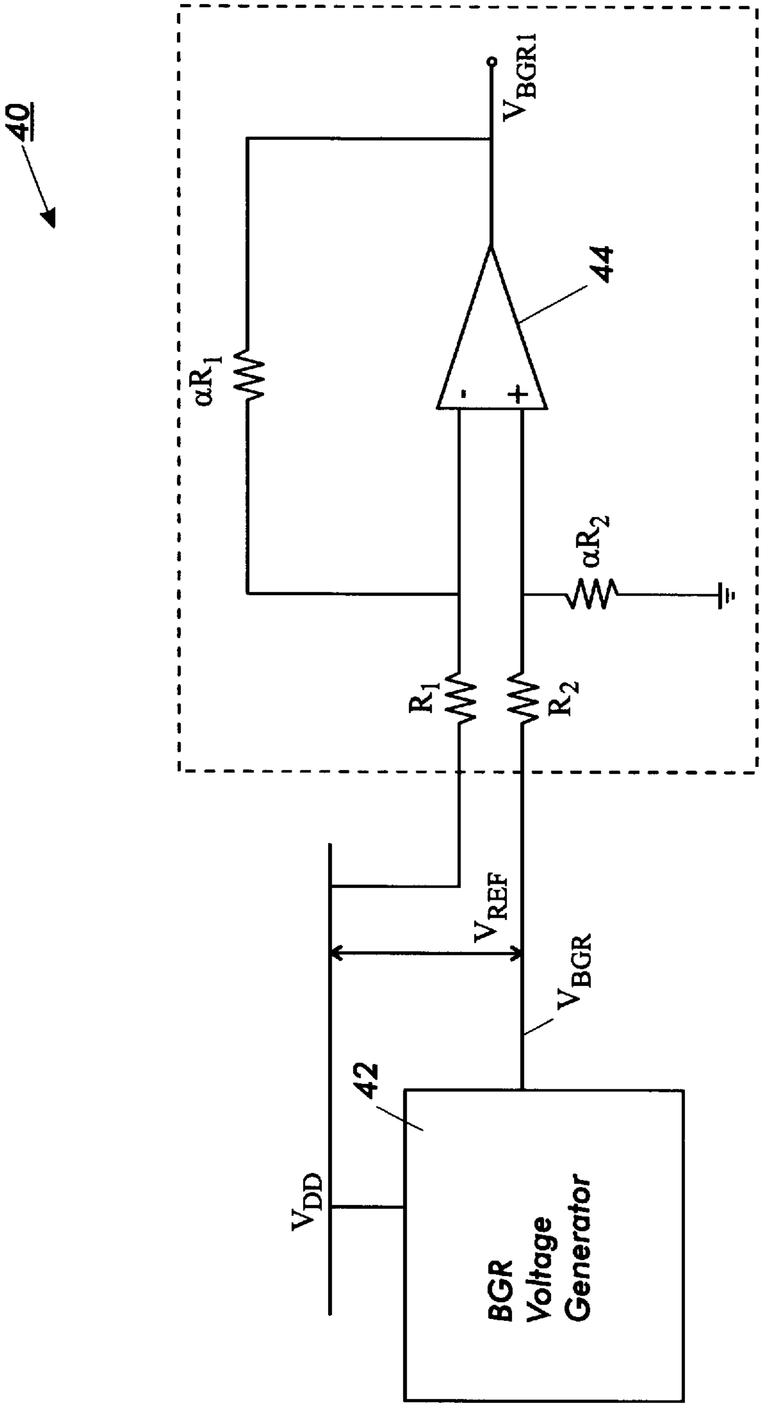
FIG. 4 shows a circuit diagram of the first approach of this invention to convert a floating reference voltage of a BGR voltage generator to a fixed reference voltage.

Referring to FIG. 4, there is shown a circuit diagram 40 of the first approach of this invention to convert a reference voltage with respect to the power supply (floating) to a reference voltage with respect to ground (fixed). Circuit 40 is connected to a BGR voltage generator 42 which generates a floating voltage $V_{BGR}$ with respect to its power supply $V_{DD}$. As a result, $V_{BGR}$ is:

$$V_{BGR}=V_{DD}-V_{REF}.$$

Where $V_{REF}$ is a temperature independent and a fixed voltage generated by a BGR voltage generator.

In FIG. 4, the power supply $V_{DD}$ is connected to the inverting (−) input of an Operational Amplifier (Op-Amp) 44 through resistor $R_1$. The floating reference voltage $V_{BGR}$ is connected to the non-inverting (+) input of the Op-Amp 44 through resistor $R_2$. The inverting (−) input of the Op-Amp 44 is also connected to the output of the Op-Amp 44 through resistor $\alpha R_1$ and the non-inverting (+) input of the Op-Amp 44 is connected to ground (GND) through resistor $\alpha R_2$. Resistor $\alpha R_1$ is equal to resistor $\alpha R_2$ and $\alpha$ is a constant factor in the impedance of the resistors $\alpha R_1$ and $\alpha R_2$.

In FIG. 4, the Op-Amp 44 works as a difference amplifier. A difference amplifier subtracts its two input voltages and sends out the result as an output voltage. Therefore, the output voltage $V_{BGR1}$ of the Op-Amp 44 is the difference between the two input voltages $V_{DD}$ and $V_{BGR}$.

$$V_{BGR1}=\alpha[V_{DD}-V_{BGR}]$$

Since $$V_{BGR}=V_{DD}-V_{REF}$$

then, $$V_{BGR1}=\alpha[V_{DD}-[V_{DD}-V_{REF}]]=\alpha V_{REF}.$$

Therefore, by subtracting $V_{BGR}$ from $V_{DD}$, only $V_{REF}$ is left. As a result, the output voltage $V_{BGR1}$ will be $\alpha$ times $V_{REF}$. This means that the output voltage is proportional to the reference voltage $V_{REF}$ regardless of fluctuations of $V_{DD}$. By selecting a proper $\alpha$, a desired fixed reference voltage can be generated.

However, this is not a practical solution since connecting $V_{BGR}$ directly to Op-Amp 44 draws current from $V_{BGR}$ which in turn causes $V_{BGR}$ to undesirably vary.

Figure 5:
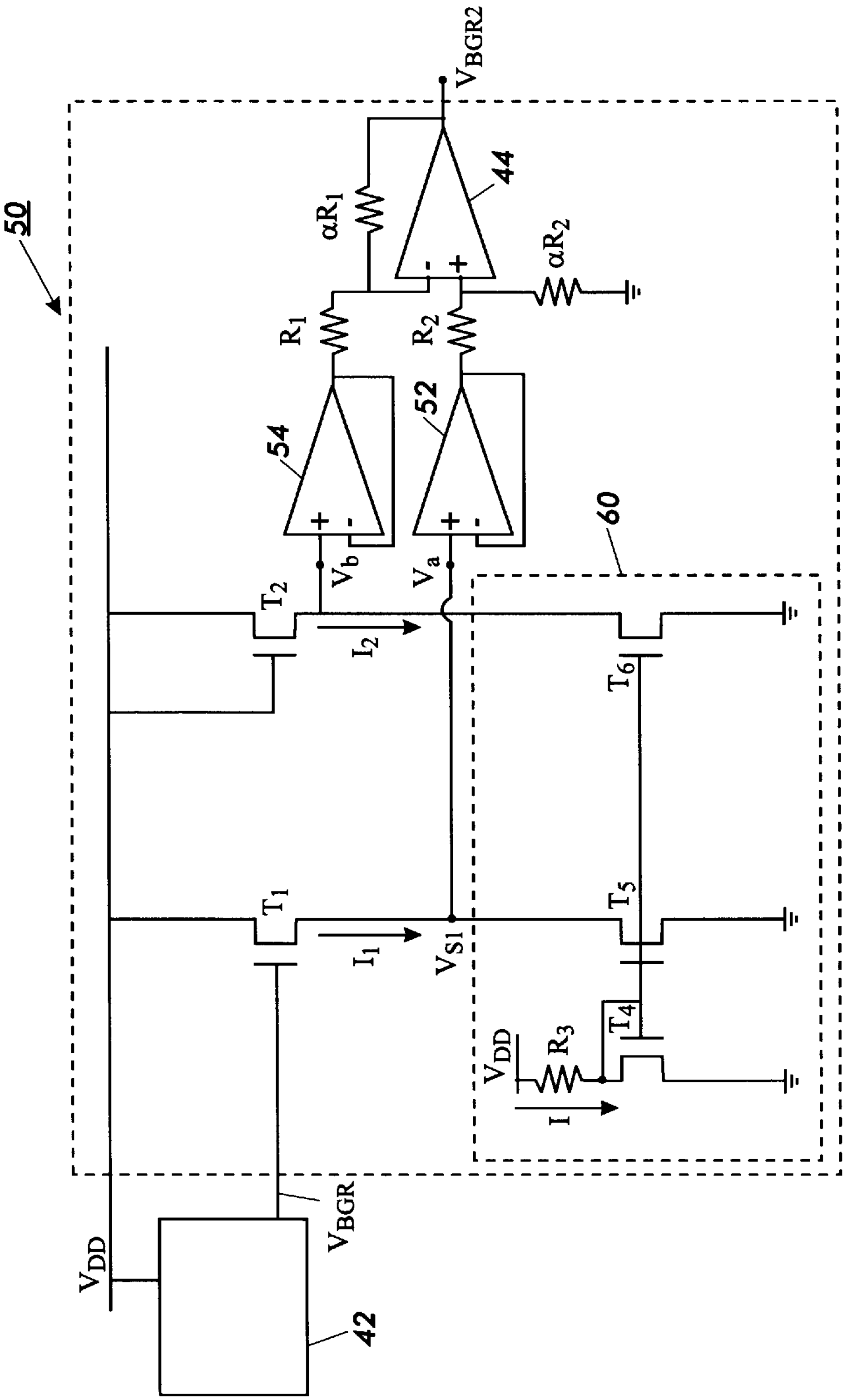
FIG. 5 shows an improved version of the circuit diagram of FIG. 6.

Referring to FIG. 5, there is shown a circuit 50 which is an improved version of circuit 40 of FIG. 4. In FIG. 5, all the elements that are the same and serve the same purpose as the elements of circuit 40 of FIG. 4 are designated by the same reference numerals. In FIG. 5, again Op-Amp 44 subtracts its two input voltages to provide a reference voltage $V_{BGR2}$ which is proportional to $V_{REF}$ of the BGR voltage generator 42.

In FIG. 5, the output voltage $V_{BGR}$ of the BGR voltage generator 42 is connected to non-inverting input of Op-Amp 44 through a Metal Oxide Silicon Field Effect Transistors (MOSFET) $T_1$ and buffer (Op-Amp) 52.

Since the common mode voltages of the Op-Amps are lower (ex: 3.5 volt) than $V_{BGR}$ (ex: 4 volts), $V_{BGR}$ has to be shifted down to match the required input voltages of Op-Amp 52. Transistor $T_1$, which is used as a level shifter to shift down the $V_{BGR}$, prevents any current being drawn from BGR voltage generator 42. $V_{BGR}$ is connected to the gate of the N-channel MOSFET (NMOS) transistor $T_1$. The drain of transistor $T_1$ is connected to $V_{DD}$ and its source is connected to the non-inverting input of Op-Amp 52. The output of the Op-Amp 52 is connected to its inverting input and also to the non-inverting input of the Op-Amp 44 through resistor $R_2$.

The gate and the drain of transistor $T_2$ are connected to $V_{DD}$ and its source is connected to the non-inverting input of Op-Amp 54. The output of the Op-Amp 54 is connected to its inverting input and also to the inverting input of the Op-Amp 44 through resistor $R_1$.

Transistor $T_1$ has a gate to source voltage $V_{GS1}$. Thus, the source voltage $V_{S1}$ of the transistor $T_1$ is:

$$V_{S1}=V_{G1}-V_{GS1}.$$

Where $V_{G1}$ is the gate voltage of the transistor $T_1$. Since node VBGR output of BGR voltage generator 42 is connected to the gate of the transistor $T_1$, the source voltage $V_{S1}$ of transistor TI is:

$$V_{S1}=V_{BGR}-V_{GS1}.$$

As a result, transistor $T_1$ shifts down voltage $V_{BGR}$ by $V_{GS1}$ to $V_{S1}$.

The Op-Amp 52 operates in linear mode due to negative feedback and therefore it delivers voltage of its non-inverting input to its output and to the non-inverting input of the Op-Amp 44 through resistor $R_2$. The voltage of non-inverting input of Op-Amp 52 and its output voltage are both equal to:

$$V_a=V_{S1}=V_{BGR}-V_{GS1}.$$

Since $$V_{BGR}=V_{DD}-V_{REF},$$

then $$V_a=V_{DD}-V_{REF}-V_{GS1}.$$

In order to subtract the two input voltages $V_a$ and $V_b$ of the difference amplifier formed by Op-Amp 54 and resistors $R_1$, $R_2$, $\alpha R_1$ and $\alpha R_2$ and have a voltage proportional to $V_{REF}$, $V_{DD}$ has to be shifted down. The reason $V_{DD}$ needs to be shifted down is that since the voltage at the non-inverting input of the Op-Amp 44 is the shifted down $V_{BGR}$ by $V_{GS1}$, $V_{DD}$ has to be shifted down by a voltage equal to $V_{GS1}$.

In order to shift down the voltage $V_{DD}$, the power supply $V_{DD}$ is connected to the gate and the drain of the transistor $T_2$. The source voltage of the transistor $T_2$ is:

$$V_{S2}=V_b=V_{DD}-V_{GS2}.$$

Where $V_{GS2}$ is the gate to source voltage of transistor $T_2$.

In order to shift down $V_{DD}$ by the same voltage as the voltage by which $V_{BGR}$ is shifted down, $V_{GS1}$ must be equal to $V_{GS2}$. Therefore, the sizes of transistors $T_1$ and $T_2$ have to be the same and the source current $I_1$ of transistor $T_1$ has to be equal to the source current $I_2$ of transistor $T_2$. In FIG. 5, a current mirror 60 is used to provide identical currents to transistors $I_1$ and $I_2$.

The current mirror 60 has three MOSFET transistors $T_4$, $T_5$ and $T_6$. The gates of transistors $T_4$, $T_5$ and $T_6$ are connected to each other and the sources of transistors $T_4$, $T_5$ and $T_6$ are grounded. The drain of transistor $T_5$ is connected to the source of transistor $T_1$ and the drain of transistor $T_6$ is connected to the source of transistor $T_2$. The drain of transistor $T_4$ is connected to its gate and also to the power supply $V_{DD}$ through resistor $R_3$. By choosing the same sizes for transistors $T_5$ and $T_6$, the current in transistors $T_5$ and $T_6$ and hence the current in transistors $T_1$ and $T_2$ will be the same.

The Op-Amp 54 operates in linear mode due to negative feedback and therefore, the voltages of its non-inverting input, inverting input and the output are all equal to:

$$V_b = V_{DD} - V_{GS2}.$$

Therefore, the output voltage $V_{BGR2}$ of Op-Amp 44 is:

$$V_{BGR2} = \alpha[V_b - V_a] = \alpha[V_{DD} - V_{GS2} - [V_{DD} - V_{REF} - V_{GS1}]] = \alpha[V_{REF} - V_{GS2} + V_{GS1}]$$

In order to have $V_{BGR2}$ proportional to $V_{REF}$, the two voltages $V_{GS1}$ and $V_{GS2}$ have to be equal to cancel each other in the above equation.

In theory, the current $I_1$ of the drain of transistor $T_5$ and the current $I_2$ of the drain of transistor $T_6$ are identical to the current I of the transistor $T_4$. However, due to the non-ideal characteristics of MOSFET transistors, since the drain to source voltage of transistor $T_1$ is different from the drain to source voltage of transistor $T_2$, their currents $I_1$ and $I_2$ are slightly different from each other. This causes $V_{GS1}$ and $V_{GS2}$ to be slightly different from each other. Therefore, $V_{GS1}$ and $V_{GS2}$ can not completely cancel each other. As a result, the output can not be exactly proportional to $V_{REF}$.

Figure 6:
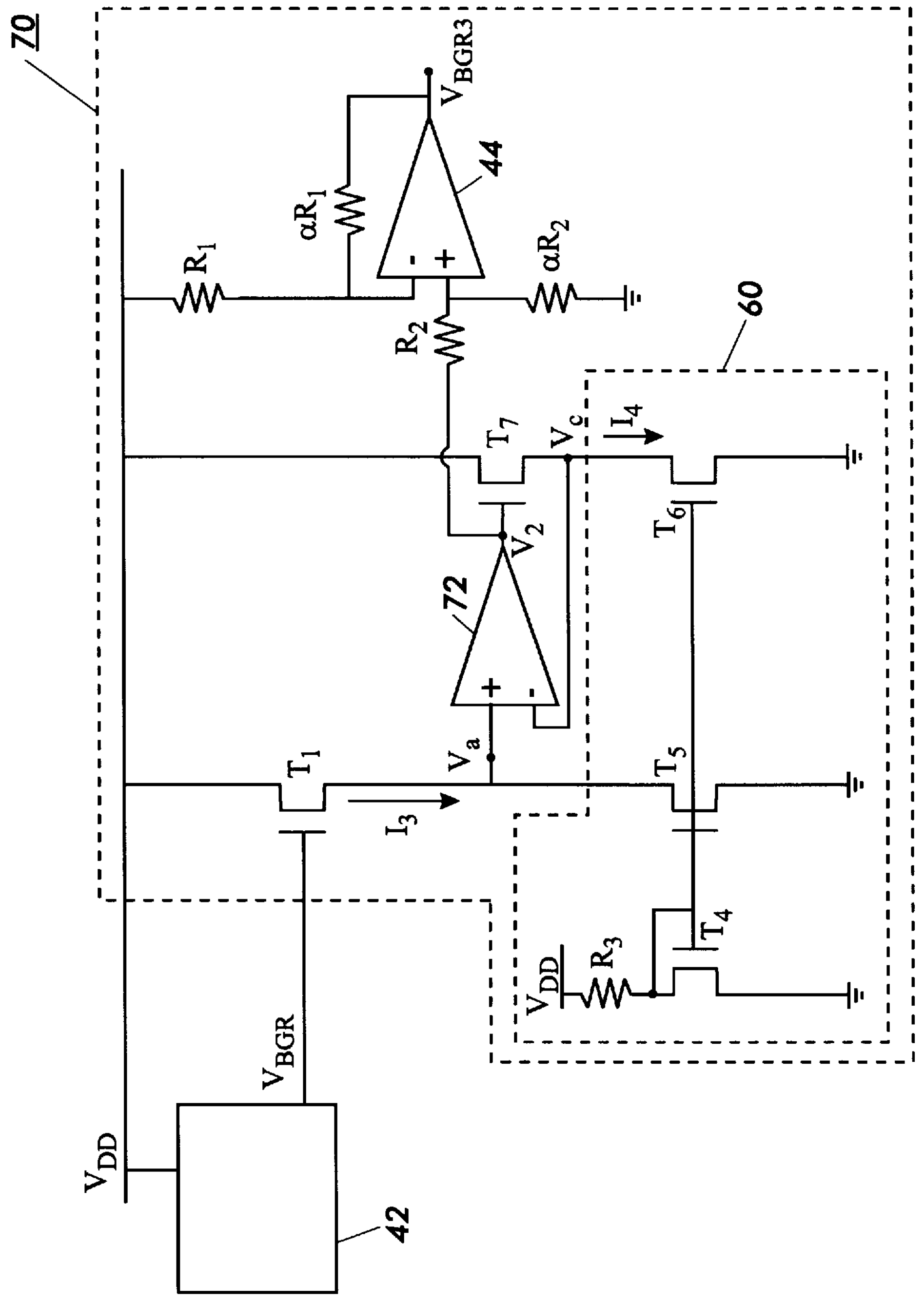
FIG. 6 shows the preferred embodiment of this invention.

Referring to FIG. 6, there is shown the preferred embodiment 70 of this invention which is an improved version of circuit 50 of FIG. 5. In FIG. 6, all the elements that are the same and serve the same purpose as the elements of circuit 50 of FIG. 5 are designated by the same reference numerals. In the same manner as circuit 50 of FIG. 5, transistor $T_1$ of FIG. 6 shifts down $V_{BGR}$ by $V_{GS1}$.

In FIG. 6, instead of shifting down the power supply $V_{DD}$, the $V_{DD}$ is connected to the inverting input of the Op-Amp 44 through resistor $R_4$ and the shifted down $V_{BGR}$ is shifted back up to $V_{BGR}$ and supplied to the difference amplifier formed by Op-Amp 44 and resistors $R_1$, $R_2$, $\alpha R_1$ and $\alpha R_2$.

The reason Op-Amp 72 is placed in circuit 70 is to prevent any current being drawn from the $V_{BGR}$ output of the BGR voltage generator 42. However, this requires the $V_{BGR}$ voltage to be shifted down to a level required by Op-Amp 72 and since $V_{DD}$ is not shifted down prior to its connection to Op-Amp 44, the shifted down $V_{BGR}$ has to be shifted up back to $V_{BGR}$ prior to its connection to Op-Amp 44.

U.S. patent application Ser. No. 08/868,662, "A Buffering Integrated Circuit With Level Shifting Function" Attorney Docket No. D/97532 (Common Assignee) filed concurrently herewith, disclosure of which is fully incorporated herein by reference, discloses a circuit which shifts down a voltage and subsequently shifts it substantially back to the original voltage. In FIG. 6, the source of transistor $T_1$ is connected to the non-inverting input of buffer 72. The output of Op-Amp 72 is connected to the gate of a NMOS transistor $T_7$. The drain of transistor $T_7$ is connected to the power supply $V_{DD}$ and the source of transistor $T_7$ is connected to the drain of transistor $T_6$.

In circuit 70, the inverting input of Op-Amp 72 is connected to the source of transistor $T_7$ which causes the source voltage $V_{S7}$ of transistor $T_7$ to be equal to the inverting and non-inverting inputs of the Op-Amp 72. It should be noted that in this configuration, the inverting and non-inverting inputs of the Op-Amp 72 are equal. Therefore, the source voltage $V_{S7}$ of the transistor $T_7$ is set to be equal to the source voltage $V_{S1}$ of transistor $T_1$. This causes the gate voltage $V_{G7}$ of transistor $T_7$ which is the output voltage of the Op-Amp 72 to be forced to be equal to:

$$V_{G7} = V_{S7} + V_{GS7},$$

where $V_{GS7}$ is the gate to source voltage of transistor $T_7$.

In this invention, transistor $T_7$ is used to guide the output of Op-Amp 72 to be shifted up. Both transistors $T_1$ and $T_7$ are NMOS transistors and they both are made with the same process and in the layout, they are placed close to each other to minimize the process variation of different locations on the wafer. As a result, the gate to source voltages $V_{GS1}$ and $V_{GS7}$ of the two transistors $T_1$ and $T_7$ are substantially the same since the transistors $T_1$ and $T_7$ have identical sizes and currents. Therefore, since the source voltage $V_{S1}$ of transistor $T_1$ is:

$$V_{S1} = V_{BGR} - V_{GS1},$$

and since $$V_{G7} = V_{S7} + V_{GS7},$$

$V_{S1} = V_{S7}$ (source voltage of $T_7$ is set by Op-Amp 72 to be equal to source voltage of $T_1$)

and $V_{GS1} = V_{GS7}$ (two identical transistors $T_1$ and $T_7$ have same currents)

then $$V_2 = V_{G7} = V_{S1} + V_{GS7} = V_{BGR} - V_{GS1} + V_{GS7} = V_{BGR}.$$

Therefore, the output voltage of Op-Amp 72 which is the gate voltage $V_{G7}$ of the transistor $T_7$ is substantially equal to the voltage $V_{BGR}$.

Furthermore, against the commonly accepted method of obtaining the level shifted output voltage from the source of transistor $T_7$, the output is obtained from the gate of transistor T7 which is also the output of the Op-Amp 24 and is buffered by the Op-Amp 72.

Op-Amp 44 receives $V_{DD}$ on its inverting input through resistors $R_1$ and $V_{BGR}$ on its non-inverting input through resistor R2. Therefore, the output voltage $V_{BGR3}$ of the Op-Amp 44 is:

$$V_{BGR3} = \alpha[V_{DD} - V_{BGR}]$$

and since $$V_{BGR} = V_{DD} - V_{REF}$$

then $$V_{BGR3} = \alpha[V_{DD} - [V_{DD} - V_{REF}]] = \alpha V_{REF}.$$

As a result, $V_{BGR}$ is proportional to $V_{REF}$.

$V_{BGR}$ is a reference voltage with respect to the power supply $V_{DD}$ and is independent of temperature variations. Therefore, circuit 70 converts a floating reference voltage to a fixed and buffered reference voltage. The disclosed embodiment of this invention can also be utilized as a dual purpose BGR voltage generator. If desired, one can use the floating reference voltage $V_{BGR}$ or the fixed reference voltage $V_{BGR3}$.

Usually, a conventional BGR voltage generator needs to be buffered since drawing current from a conventional BGR generator disturbs its performance and accuracy. In contrast to a conventional BGR voltage generator, the disclosed embodiments of this invention provide a fixed reference voltage which is also buffered and can provide current to external circuits. This is due to the fact that the output voltage is taken from the output of an Op-Amp which is capable of delivering current without disturbing its output voltage.

It should be noted that circuits 40, 50 and 70 can be built as a stand alone circuit to be used in conjunction with a floating reference voltage generator or each can be built as an integrated circuit in conjunction with a floating reference voltage generator on a common substrate.

It should also be noted that the usage of the disclosed embodiments of this invention is not limited to BGR voltage generators made with P-substrate CMOS technology. The disclosed embodiments of this invention can be used in conjunction with any type of reference voltage generator which generates a floating reference voltage.

It should further be noted that numerous changes in details of construction and the combination and arrangement of elements may be resorted to without departing from the true spirit and scope of the invention as hereinafter claimed.

We claim:

1. A circuit for converting a floating voltage of a reference voltage generator to a fixed voltage with respect to ground comprising:

a subtracting means having a first input, a second input and an output;

a power source generating a voltage;

said power source being electrically connected to said first input of said subtracting means;

a floating voltage source generating a floating voltage with respect to said voltage of said power source;

said floating voltage being a fixed voltage below said voltage of said power source;

a buffering means having an input and an output;

a first level shifting means;

a second level shifting means;

said floating voltage source being electrically connected to said second input of said subtracting means through said first level shifting means, said buffering means and said second level shifting means;

said buffering means preventing any current being drawn from said floating voltage source;

said first level shifting means shifting down said floating voltage of said second voltage source to match the required input level of said buffering means and said second level shifting means shifting up said shifted down voltage at the output of said buffer to substantially the same level as the floating voltage; and said subtracting means being so constructed and arranged to subtract said voltage at said first input from said voltage at said second input to provide a voltage difference with respect to ground as an output voltage at said output, said output voltage being independent of temperature and power supply variations.

2. The integrated circuit for converting a floating voltage of a reference voltage generator to a fixed voltage with respect to ground as recited in claim 1, wherein said floating reference voltage is a Band Gap Reference voltage generator.

3. The integrated circuit for converting a floating voltage of a reference voltage generator to a fixed voltage with respect to ground as recited in claim 2, wherein said floating reference voltage is fabricated in P-substrate CMOS technology.

4. The circuit for converting a floating voltage of a reference voltage generator to a fixed voltage with respect to ground as recited in claim 1, wherein said circuit for converting floating voltage to a fixed voltage is an integrated circuit.

5. The integrated circuit for converting a floating voltage of a reference voltage generator to a fixed voltage with respect to ground as recited in claim 4, wherein said integrated circuit is fabricated in P-substrate CMOS technology.

6. The integrated circuit for converting a floating voltage of a reference voltage generator to a fixed voltage with respect to ground as recited in claim 5, wherein said floating reference voltage is a Band Gap Reference voltage generator.

7. A circuit for converting a floating voltage of a reference voltage generator to a fixed voltage with respect to ground comprising:

a subtracting means having a first input, a second input and an output;

a power source generating a voltage;

a first level shifting means;

a first buffering means;

said power source being electrically connected to said first input of said subtracting means through said first level shifter and said first buffering means;

said buffering means preventing any current being drawn from said power source;

said first level shifting means shifting down said voltage of said power source to match the required input level of said buffering means;

a floating voltage source generating a floating voltage with respect to said voltage of said power source;

said floating voltage being a fixed voltage below said voltage of said power source;

a second level shifting means;

a second buffering means;

said floating voltage source being electrically connected to said second input of said subtracting means through said second level shifting means and said second buffering means;

said second buffering means preventing any current being drawn from said floating voltage source;

said second level shifting means shifting down said floating voltage of said second voltage source to match the required input level of said buffering means;

said level shift down of said first level shifting means being equal to said level shift down of said second level shifting means; and said subtracting means being so constructed and arranged to subtract said voltage at said first input from said voltage at said second input to provide a voltage difference with respect to ground as an output voltage at said output, said output voltage being independent of temperature and power supply variations.

8. The integrated circuit for converting a floating voltage of a reference voltage generator to a fixed voltage with respect to ground as recited in claim 7, wherein said floating reference voltage is a Band Gap Reference voltage generator.

9. The integrated circuit for converting a floating voltage of a reference voltage generator to a fixed voltage with respect to ground as recited in claim 8, wherein said floating reference voltage is fabricated in P-substrate CMOS technology.

10. The circuit for converting a floating voltage of a reference voltage generator to a fixed voltage with respect to ground as recited in claim 7, wherein said circuit for converting floating voltage to a fixed voltage is an integrated circuit.

11. The integrated circuit for converting a floating voltage of a reference voltage generator to a fixed voltage with respect to ground as recited in claim 10, wherein said integrated circuit is fabricated in P-substrate CMOS technology.

12. The integrated circuit for converting a floating voltage of a reference voltage generator to a fixed voltage with respect to ground as recited in claim 11, wherein said floating reference voltage is a Band Gap Reference voltage generator.

* * * * *